US011476674B2

(12) United States Patent
Rumrill

(10) Patent No.: US 11,476,674 B2
(45) Date of Patent: Oct. 18, 2022

(54) SYSTEMS AND METHODS TO MAXIMIZE POWER FROM MULTIPLE POWER LINE ENERGY HARVESTING DEVICES

(71) Applicant: Sentient Technology Holdings, LLC, Wichita, KS (US)

(72) Inventor: Ronald S. Rumrill, Union City, CA (US)

(73) Assignee: SENTIENT TECHNOLOGY HOLDINGS, LLC, Wichita, KS (US)

(*) Notice: Subject to any disclaimer, the term of this patent is extended or adjusted under 35 U.S.C. 154(b) by 0 days.

(21) Appl. No.: 16/575,220

(22) Filed: Sep. 18, 2019

(65) Prior Publication Data
US 2020/0091721 A1 Mar. 19, 2020

Related U.S. Application Data

(60) Provisional application No. 62/732,818, filed on Sep. 18, 2018.

(51) Int. Cl.
*H02J 3/28* (2006.01)
*G01R 19/25* (2006.01)
(52) U.S. Cl.
CPC ............ *H02J 3/28* (2013.01); *G01R 19/2513* (2013.01)
(58) Field of Classification Search
CPC ............................... H02J 3/28; G01R 19/2513
See application file for complete search history.

(56) References Cited

U.S. PATENT DOCUMENTS

| 3,075,166 A | 1/1963 | Peek |
| 3,558,984 A | 1/1971 | Smith et al. |
| 3,676,740 A | 7/1972 | Schweitzer, Jr. |
| 3,686,531 A | 8/1972 | Decker et al. |
| 3,702,966 A | 11/1972 | Schweitzer, Jr. |
| 3,708,724 A | 1/1973 | Schweitzer, Jr. |

(Continued)

FOREIGN PATENT DOCUMENTS

| EP | 1508146 A | 2/2005 |
| EP | 1938159 A | 7/2008 |

(Continued)

OTHER PUBLICATIONS

Chen et al.; Development of arc-guided protection devices against lightning breakage of covered conductors on distribution lines; IEEE Trans. Power Deliv.; 25(1); pp. 196-205; Jan. 2010.

(Continued)

*Primary Examiner* — Daniel Kessie
*Assistant Examiner* — Brian K Baxter

(57) ABSTRACT

A power distribution monitoring system is provided that can include a number of features. The system can include a plurality of monitoring devices configured to attach to individual conductors on a power grid distribution network. In some embodiments, a monitoring device is disposed on each conductor of a three-phase network and utilizes a split-core transformer to harvest energy from the conductors. The monitoring devices can be configured to harvest energy from the AC power grid. In some embodiments, the monitoring devices are configured to draw a ratiometric current to maintain an output resistance that equals an input resistance. Methods of installing and using the monitoring devices are also provided.

12 Claims, 5 Drawing Sheets

(56) References Cited

U.S. PATENT DOCUMENTS

| | | |
|---|---|---|
| 3,715,742 A | 2/1973 | Schweitzer, Jr. |
| 3,720,872 A | 3/1973 | Russell et al. |
| 3,725,832 A | 4/1973 | Schweitzer, Jr. |
| 3,755,714 A | 8/1973 | Link |
| 3,768,011 A | 10/1973 | Swain |
| 3,777,217 A | 12/1973 | Groce et al. |
| 3,814,831 A | 6/1974 | Olsen |
| 3,816,816 A | 6/1974 | Schweitzer, Jr. |
| 3,866,197 A | 2/1975 | Schweitzer, Jr. |
| 3,876,911 A | 4/1975 | Schweitzer, Jr. |
| 3,957,329 A | 5/1976 | McConnell |
| 3,970,898 A | 7/1976 | Baumann et al. |
| 4,063,161 A | 12/1977 | Pardis |
| 4,152,643 A | 5/1979 | Schweitzer, Jr. |
| 4,161,761 A * | 7/1979 | Moran .................... H02H 3/34 |
| | | 361/94 |
| 4,339,792 A | 7/1982 | Yasumura et al. |
| 4,378,525 A | 3/1983 | Burdick |
| 4,396,794 A | 8/1983 | Stiller |
| 4,396,968 A | 8/1983 | Stiller |
| 4,398,057 A | 8/1983 | Shankle et al. |
| 4,408,155 A | 10/1983 | McBride |
| 4,466,071 A | 8/1984 | Russell, Jr. |
| 4,559,491 A | 12/1985 | Saha |
| 4,570,231 A | 2/1986 | Bunch |
| 4,584,523 A | 4/1986 | Elabd |
| 4,649,457 A | 3/1987 | Talbot et al. |
| 4,654,573 A | 3/1987 | Rough et al. |
| 4,709,339 A | 11/1987 | Fernandes |
| 4,714,893 A | 12/1987 | Vaniz et al. |
| 4,723,220 A | 2/1988 | Vaniz |
| 4,728,887 A | 3/1988 | Davis |
| 4,746,241 A | 5/1988 | Burbank |
| 4,766,549 A | 8/1988 | Schweitzer, III et al. |
| 4,775,839 A | 10/1988 | Kosina et al. |
| 4,808,916 A | 2/1989 | Smith Vaniz |
| 4,829,298 A | 5/1989 | Fernandes |
| 4,881,028 A | 11/1989 | Bright |
| 4,886,980 A | 12/1989 | Fernandes et al. |
| 4,904,932 A | 2/1990 | Schweitzer, Jr. |
| 4,937,769 A | 6/1990 | Verbanets |
| 5,006,846 A | 4/1991 | Granville et al. |
| 5,125,738 A | 6/1992 | Kawamura et al. |
| 5,138,265 A | 8/1992 | Kawamura et al. |
| 5,159,561 A | 10/1992 | Watanabe et al. |
| 5,181,026 A | 1/1993 | Granville |
| 5,182,547 A | 1/1993 | Griffith |
| 5,202,812 A | 4/1993 | Shinoda et al. |
| 5,206,595 A | 4/1993 | Wiggins et al. |
| 5,220,311 A | 6/1993 | Schweitzer, Jr. |
| 5,428,549 A | 6/1995 | Chen |
| 5,438,256 A | 8/1995 | Thuries et al. |
| 5,473,244 A | 12/1995 | Libove et al. |
| 5,495,169 A | 2/1996 | Smith |
| 5,519,560 A * | 5/1996 | Innes .................... G01R 15/183 |
| | | 361/87 |
| 5,550,476 A | 8/1996 | Lau et al. |
| 5,600,248 A | 2/1997 | Westrom et al. |
| 5,608,328 A | 3/1997 | Sanderson |
| 5,650,728 A | 7/1997 | Rhein et al. |
| 5,656,931 A | 8/1997 | Lau et al. |
| 5,682,100 A | 10/1997 | Rossi et al. |
| 5,696,788 A | 12/1997 | Choi et al. |
| 5,712,796 A | 1/1998 | Ohura et al. |
| 5,729,144 A | 3/1998 | Cummins |
| 5,737,203 A | 4/1998 | Barrett |
| 5,764,065 A | 6/1998 | Richards et al. |
| 5,839,093 A | 11/1998 | Novosel et al. |
| 5,892,430 A | 4/1999 | Wiesman et al. |
| 5,905,646 A | 5/1999 | Crewson et al. |
| 5,990,674 A | 11/1999 | Schweitzer, Jr. |
| 6,002,260 A | 12/1999 | Lau et al. |
| 6,016,105 A | 1/2000 | Schweitzer, Jr. |
| 6,043,433 A | 3/2000 | Schweitzer, Jr. |
| 6,133,723 A | 10/2000 | Feight |
| 6,133,724 A | 10/2000 | Schweitzer, Jr. et al. |
| 6,288,632 B1 | 9/2001 | Hector et al. |
| 6,292,340 B1 | 9/2001 | O'Regan et al. |
| 6,347,027 B1 | 2/2002 | Nelson et al. |
| 6,433,698 B1 | 8/2002 | Schweitzer, Jr. et al. |
| 6,459,998 B1 | 10/2002 | Hoffman |
| 6,466,030 B2 | 10/2002 | Hu et al. |
| 6,466,031 B1 | 10/2002 | Hu et al. |
| 6,477,475 B1 | 11/2002 | Takaoka et al. |
| 6,483,435 B2 | 11/2002 | Saha et al. |
| 6,549,880 B1 | 4/2003 | Willoughby et al. |
| 6,559,651 B1 | 5/2003 | Crick |
| 6,566,854 B1 | 5/2003 | Hagmann et al. |
| 6,577,108 B2 | 6/2003 | Hubert et al. |
| 6,601,001 B1 | 7/2003 | Moore |
| 6,622,285 B1 | 9/2003 | Rust et al. |
| 6,677,743 B1 | 1/2004 | Coolidge et al. |
| 6,718,271 B1 | 4/2004 | Tobin |
| 6,734,662 B1 | 5/2004 | Fenske |
| 6,798,211 B1 | 9/2004 | Rockwell et al. |
| 6,822,457 B2 | 11/2004 | Borchert et al. |
| 6,822,576 B1 | 11/2004 | Feight et al. |
| 6,879,917 B2 | 4/2005 | Turner |
| 6,894,478 B1 | 5/2005 | Fenske |
| 6,914,763 B2 | 7/2005 | Reedy |
| 6,917,888 B2 | 7/2005 | Logvinov et al. |
| 6,927,672 B2 | 8/2005 | Zalitzky et al. |
| 6,949,921 B1 | 9/2005 | Feight et al. |
| 6,963,197 B1 | 11/2005 | Feight et al. |
| 6,980,090 B2 | 12/2005 | Mollenkopf |
| 7,023,691 B1 | 4/2006 | Feight et al. |
| 7,046,124 B2 | 5/2006 | Cope et al. |
| 7,053,601 B1 | 5/2006 | Fenske et al. |
| 7,072,163 B2 | 7/2006 | McCollough, Jr. |
| 7,076,378 B1 | 7/2006 | Huebner |
| 7,085,659 B2 | 8/2006 | Peterson et al. |
| 7,106,048 B1 | 9/2006 | Feight et al. |
| 7,158,012 B2 | 1/2007 | Wiesman et al. |
| 7,187,275 B2 | 3/2007 | McCollough, Jr. |
| 7,203,622 B2 | 4/2007 | Pan et al. |
| 7,272,516 B2 | 9/2007 | Wang et al. |
| 7,295,133 B1 | 11/2007 | McCollough, Jr. |
| 7,400,150 B2 | 7/2008 | Cannon |
| 7,424,400 B2 | 9/2008 | McCormack et al. |
| 7,449,991 B2 | 11/2008 | Mollenkopf |
| 7,450,000 B2 | 11/2008 | Gidge et al. |
| 7,508,638 B2 | 3/2009 | Hooper |
| 7,518,529 B2 | 4/2009 | O'Sullivan et al. |
| 7,532,012 B2 | 5/2009 | Cern |
| 7,557,563 B2 | 7/2009 | Gunn et al. |
| 7,586,380 B1 * | 9/2009 | Natarajan .............. H03K 3/011 |
| | | 331/176 |
| 7,626,794 B2 | 12/2009 | Swartzendruber et al. |
| 7,633,262 B2 | 12/2009 | Lindsey et al. |
| 7,672,812 B2 | 3/2010 | Stoupis et al. |
| 7,683,798 B2 | 3/2010 | Rostron |
| 7,701,356 B2 | 4/2010 | Curt et al. |
| 7,714,592 B2 | 5/2010 | Radtke et al. |
| 7,720,619 B2 | 5/2010 | Hou |
| 7,725,295 B2 | 5/2010 | Stoupis et al. |
| 7,742,393 B2 | 6/2010 | Bonicatto et al. |
| 7,764,943 B2 | 7/2010 | Radtke |
| 7,795,877 B2 | 9/2010 | Radtke et al. |
| 7,795,994 B2 | 9/2010 | Radtke |
| 7,804,280 B2 | 9/2010 | Deaver, Sr. et al. |
| 7,930,141 B2 | 4/2011 | Banting |
| 8,421,444 B2 | 4/2013 | Gunn |
| 8,497,781 B2 | 7/2013 | Engelhardt et al. |
| 8,594,956 B2 | 11/2013 | Banting et al. |
| 8,786,292 B2 | 7/2014 | Parsons |
| 8,847,576 B1 * | 9/2014 | Hannam ............... G01R 15/185 |
| | | 324/117 R |
| 9,182,429 B2 | 11/2015 | Saxby et al. |
| 9,229,036 B2 | 1/2016 | Kast et al. |
| 9,383,394 B2 * | 7/2016 | Banting ............. G01R 19/2513 |
| 9,448,257 B2 | 9/2016 | Saxby et al. |
| 9,581,624 B2 | 2/2017 | Rostron et al. |
| 9,954,354 B2 | 4/2018 | Baker et al. |
| 9,984,818 B2 | 5/2018 | Rumrill |

(56) References Cited

U.S. PATENT DOCUMENTS

| | | | |
|---|---|---|---|
| 10,298,208 B1* | 5/2019 | Venkatramani | H03H 11/28 |
| 2004/0156154 A1 | 8/2004 | Lazarovich et al. | |
| 2005/0073200 A1 | 4/2005 | Divan et al. | |
| 2008/0077336 A1 | 3/2008 | Fernandes | |
| 2009/0058582 A1 | 3/2009 | Webb | |
| 2009/0309754 A1 | 12/2009 | Bou et al. | |
| 2010/0085036 A1 | 4/2010 | Banting et al. | |
| 2011/0032739 A1 | 2/2011 | Juhlin | |
| 2012/0039062 A1 | 2/2012 | McBee et al. | |
| 2012/0081824 A1* | 4/2012 | Narendra | H02H 3/46 361/86 |
| 2012/0236611 A1 | 9/2012 | Alexandrov et al. | |
| 2013/0076323 A1* | 3/2013 | Huang | H02M 3/158 323/274 |
| 2013/0162136 A1 | 6/2013 | Baldwin et al. | |
| 2013/0169361 A1* | 7/2013 | Killat | H03F 1/26 330/253 |
| 2014/0062221 A1 | 3/2014 | Papastergiou et al. | |
| 2014/0145858 A1 | 5/2014 | Miller et al. | |
| 2014/0174170 A1 | 6/2014 | Davis | |
| 2014/0192458 A1 | 7/2014 | Valdes | |
| 2014/0226366 A1 | 8/2014 | Morokuma et al. | |
| 2014/0260598 A1 | 9/2014 | Miller | |
| 2015/0002165 A1* | 1/2015 | Juntunen | H02J 50/00 324/537 |
| 2015/0198667 A1 | 7/2015 | Krekeler | |
| 2015/0372626 A1* | 12/2015 | Bartl | H02P 9/48 322/91 |
| 2015/0378379 A1* | 12/2015 | Bhattad | G05F 1/575 323/280 |
| 2016/0116505 A1 | 4/2016 | Kast et al. | |
| 2016/0164310 A1* | 6/2016 | Juntunen | H02J 7/345 320/134 |
| 2016/0276950 A1* | 9/2016 | Koo | H01F 38/28 |
| 2017/0199533 A1 | 7/2017 | McCollough | |
| 2018/0003744 A1* | 1/2018 | Juntunen | H02J 3/32 |
| 2018/0143234 A1 | 5/2018 | Saxby | |
| 2018/0287370 A1* | 10/2018 | Kinsella | H02H 7/085 |
| 2019/0021154 A1* | 1/2019 | Sadwick | H05B 45/37 |
| 2020/0052488 A1* | 2/2020 | Desmarais | G01R 19/2513 |
| 2020/0373850 A1* | 11/2020 | Valtysson | G01R 19/2513 |

FOREIGN PATENT DOCUMENTS

| | | |
|---|---|---|
| EP | 2340592 A | 7/2011 |
| EP | 2350764 A | 8/2011 |

OTHER PUBLICATIONS

Chen Yang Technologies; Split core hall effect dc current sensor CYHCT-C2TC; 4 pages; retrieved from the internet Jan. 5, 2015 (http://www.hallsensors.de/CYHCT-C2TC.pdf) (Product Information).

Saha et al.; Fault Location on Power Networks (Power Systems); Springer Verlag; London, UK; 435 pgs.; 2010 (Preface: Oct. 2009).

Shepard et al.; An overview of rogowski coil current sensing technology; 13 pages; retrieved from the internet Jan. 5, 2016 (http://www.dynamp.net/ldadocum.nsf/c2270fbdd892ac3e86256e75000ad88a/e710af6d3e0f6255862565d7004b19db/$FILE/Report.pdf).

Stringfield et al.; Fault location methods for overhead lines; in Transactions of the American Institute of Electrical Engineers; Amer. Inst, of Electrical Eng.; New York, NY; Part. III; vol. 76; pp. 518-530; Aug. 1957.

Rumrill; U.S. Appl. No. 16/574,465 entitled "Systems and methods to measure primary voltage using capacitive coupled test point and grounded sensor circuit," filed Sep. 18, 201.

Rumrill; U.S. Appl. No. 16/574,486 entitled "Distrubance detecting current sensor," filed Sep. 18, 2019.

* cited by examiner

SYSTEMS AND METHODS TO MAXIMIZE POWER FROM MULTIPLE POWER LINE ENERGY HARVESTING DEVICES

CROSS REFERENCE TO RELATED APPLICATIONS

This application claims the benefit of U.S. Provisional Patent Application No. 62/732,818, filed Sep. 18, 2018, titled "Systems and Methods to Maximize Power From Multiple Power Line Energy Harvesting Devices", the contents of which are incorporated by reference herein.

INCORPORATION BY REFERENCE

All publications and patent applications mentioned in this specification are herein incorporated by reference to the same extent as if each individual publication or patent application was specifically and individually indicated to be incorporated by reference.

FIELD

The present application relates generally to distribution line monitoring, sensor monitoring, and power harvesting.

BACKGROUND

Power harvesting using induction pick-up from the magnetic field surrounding a power distribution line can be used to provide power to distribution line monitoring sensors. Typically, the power line is routed through a current transformer whereby an AC signal is derived from the magnetic field induced by the AC current flow in the distribution line. The AC signal is converted to DC as part of the power harvesting process and used to power the monitoring sensors and associated electronics. This is typically referred to as "inductive harvesting using current transformers."

While a true current transformer is designed to provide an accurate ratio of primary to secondary current, a distribution line monitoring sensor with an energy harvesting device must also produce an adequate output voltage, and thus traditional devices typically deviates away from being an accurate current source.

Because of the complex nature of the harvesting device's voltage, current and phase relationships, the maximum utilization of the power cannot be achieved by directly connecting multiple harvest devices in series or in parallel. Furthermore, the current levels of the individual primary conductors cannot be assumed to be precisely equal, and may in fact differ by significant amounts.

There is a need to be able to harvest power from power distribution lines in approximate proportion to the individual primary currents.

SUMMARY OF THE DISCLOSURE

This disclosure generally provides distribution line monitoring sensors that include a number of features. Particularly, described herein are distribution line monitoring sensors with energy harvesting devices that are configured to maximize harvested power from power distribution lines. Additionally, described herein are distribution line monitoring sensors with energy harvesting devices that provide a constant current output characteristic to allow maximum utilization of power by connecting multiple devices in series or in parallel.

In some embodiments, this disclosure provides for the use of multiple magnetic cores to allow for installation on differing primary conductors in a polyphase power system. This provides advantages in overall redundancy, in cases where one or more of the polyphase conductors is disconnected or has insufficient harvesting capacity. Alternately, multiple magnetic cores can be placed on the same primary conductor in order to harvest more power than fewer cores could provide.

A method of harvesting energy from one or more conductors of a power grid distribution network is provided, comprising the steps of harvesting energy from the one or more conductors with a first energy harvesting device installed on the one or more conductors, presenting an input current and an input voltage from the first energy harvesting device to a first energy harvesting circuit, drawing a first ratiometric current from the first energy harvesting device with the first energy harvesting circuit such that a ratio of the input voltage to the input current equals a desired loading resistance of the first energy harvesting circuit.

In one embodiment, the method can further comprise harvesting energy from the one or more conductors with a second energy harvesting device installed on the one or more conductors, presenting an input current and an input voltage from the second energy harvesting device to a second energy harvesting circuit, drawing a second ratiometric current from the second energy harvesting device with the second energy harvesting circuit such that a ratio of the input voltage to the input current equals a desired loading resistance of the second energy harvesting circuit, summing the first ratiometric current with the second ratiometric current to form a combined harvested current, and delivering the combined harvested current to a line monitoring device.

In some embodiments, drawing the first ratiometric current further comprises adjusting a resistance of the first energy harvesting circuit to the desired loading resistance.

In another embodiment, adjusting the resistance of the first energy harvesting circuit comprises implementing a plurality of cascading op-amps to be in balance when the input voltage divided by the input current equal the desired loading resistance.

In some embodiments, the desired loading resistance comprises 100 ohms.

An energy harvesting circuit configured to receive an input current and an input voltage from an energy harvesting device is also provided, comprising a drive circuit configured to provide an output indicating if a load resistance of the energy harvesting circuit is above or below a desired load resistance, and a boost regulator configured to receive the output and to adjust the input voltage to match the load resistance of the energy harvesting circuit to the desired load resistance, wherein an output of the energy harvesting circuit is an output current set by the available power of the energy harvesting device when loaded with the load resistance of the energy harvesting circuit.

In some embodiments, the drive circuit comprises a plurality of cascading op-amps configured to be in balance when the input voltage divided by the input current equals the desired load resistance.

In one embodiment, the desired load resistance comprises 100 ohms.

An energy harvesting system is also provided, comprising a first energy harvesting circuit configured to receive a first input current and a first input voltage from a first energy harvesting device, the first energy harvesting circuit being configured to draw a first ratiometric current from the first energy harvesting device such that a first ratio of the first input voltage to the first input current equals a first desired loading resistance of the first energy harvesting circuit, a second energy harvesting circuit configured to receive a second input current and a second input voltage from a second energy harvesting device, the second energy harvesting circuit being configured to draw a second ratiometric current from the second energy harvesting device such that a second ratio of the second input voltage to the second input current equals a second desired loading resistance of the second energy harvesting circuit, a summation circuit configured to sum the first ratiometric current with the second ratiometric current into a combined current output, and a line monitoring device configured to receive the combined current output for operation.

In some embodiments, the first and second energy harvestings circuits each include a plurality of cascading op-amps configured to be in balance when the input voltage divided by the input current equals the desired load resistance.

In one embodiment, the first desired load resistance comprises 100 ohms.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figure 1:
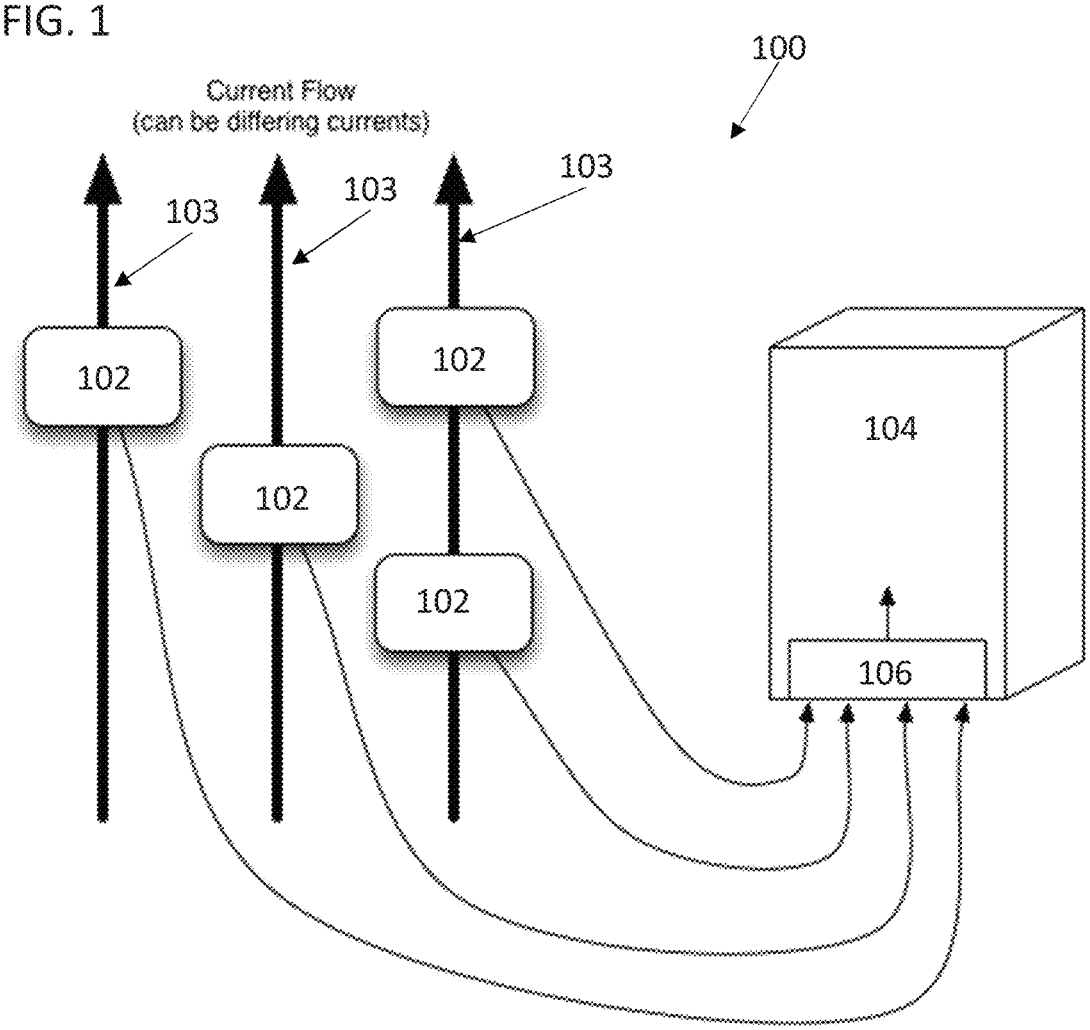
FIG. 1 illustrates an underground power distribution network with a plurality of harvesting devices located in close proximity to an underground enclosure.

Power line monitoring devices and systems described herein are configured to measure the currents and voltages of power grid distribution networks. Referring to FIG. 1, a monitoring system 100 comprises a plurality of energy harvesting devices 102 mounted to underground conductors 103 of an underground power distribution network. As shown, each of the conductors can have one or more energy harvesting device 102 mounted to the conductors. The energy harvesting devices 102 are connected to a single monitoring device 104. The power distribution network can be a three phase AC network, or alternatively, a single-phase network, for example. The power distribution network can be any type of network, such as a 60 Hz North American network, or alternatively, a 50 Hz network such as is found in Europe and Asia, for example. The monitoring device can also be used on high voltage "transmission lines" that operate at voltages higher than 65 kV.

The energy harvesting devices can be mounted on each power line of a three-phase network, as shown, and can be configured to generate or harvest power from the conductors to provide power for the operation of the monitoring device 104. The energy harvesting devices 102 are configured to convert the changing magnetic field surrounding the distribution lines into current and/or voltage that can be rectified into DC current and used to power the monitoring devices. Each of the energy harvesting devices can harvest and produce an output comprising a DC current, which can then be summed in parallel at circuit element 106 to provide a single DC current input to the monitoring device 104 for operation.

The monitoring device can be configured to monitor, among other things, current flow in the power lines and current waveforms, conductor temperatures, ambient temperatures, vibration, and monitoring device system diagnostics. In additional embodiments, multiple energy harvesting devices can be used on a single phase line. The monitoring device can further include wireless and or wired transmission and receiving capabilities for communication with a central server and for communications between other monitoring devices.

The monitoring device can be configured to also measure the electric field surrounding the power lines, to record and analyze event/fault signatures, and to classify event waveforms. Current and electric field waveform signatures can be monitored and catalogued by the monitoring device to build a comprehensive database of events, causes, and remedial actions. In some embodiments, an application executed on a central server can provide waveform and event signature cataloguing and profiling for access by the monitoring devices and by utility companies. This system can provide fault localization information with remedial action recommendations to utility companies, pre-emptive equipment failure alerts, and assist in power quality management of the distribution grid.

Figure 2:
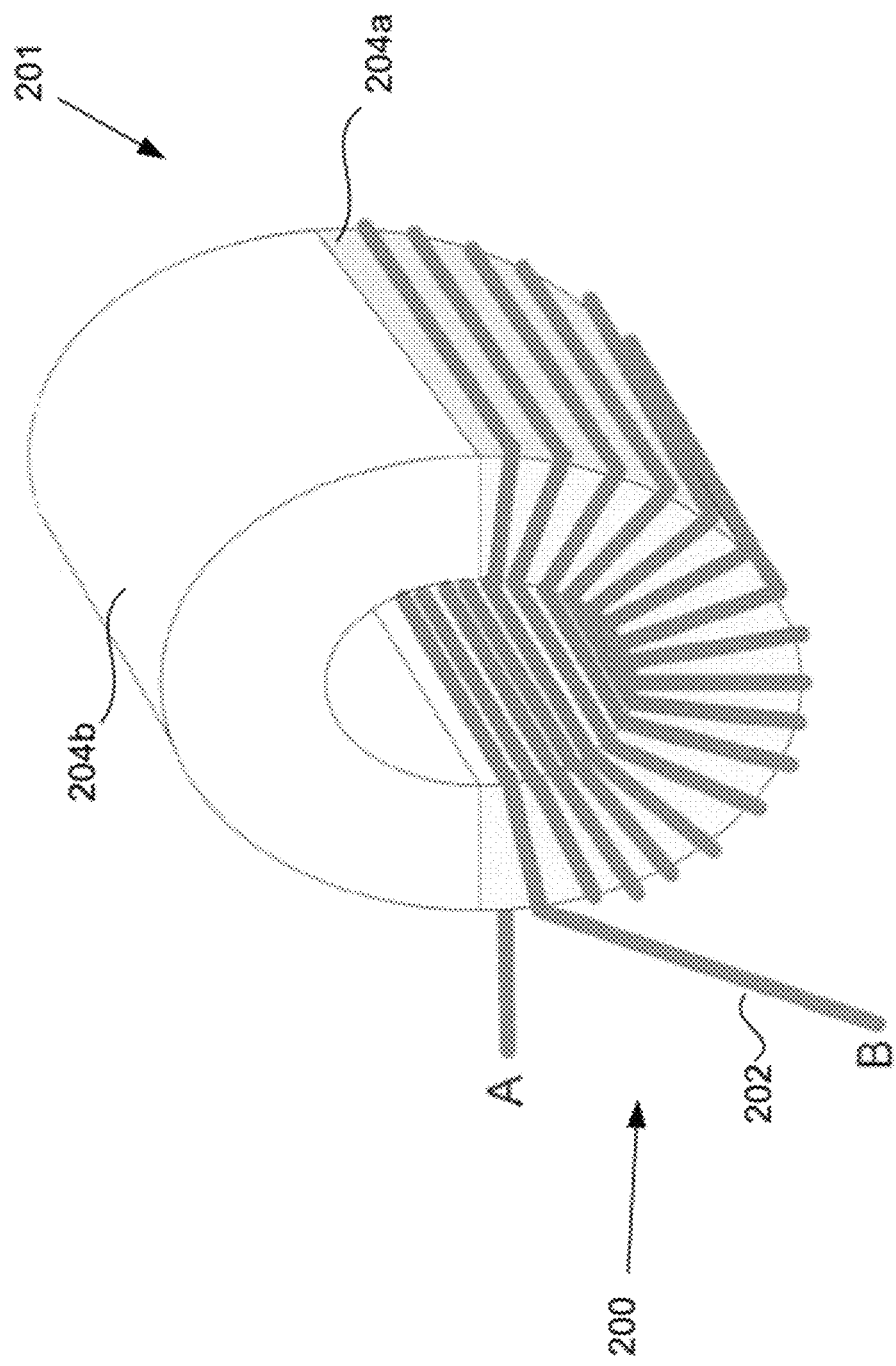
FIG. 2 shows the upper half of the power harvesting current transformer positioned above the lower half in what would be the closed position for normal operation. The upper and lower core halves separate with the mechanics of the housing to facilitate mounting the core on a power line.

FIG. 2 illustrates one embodiment of a power harvesting system 200, which can be included in the energy harvesting devices of FIG. 1. In some embodiments, the power harvesting system is positioned in the energy harvesting devices so as to surround the power lines when the energy harvesting devices are installed.

Referring to FIG. 2, power harvesting system 200 can include a split core transformer 201 having first and second core halves 204a and 204b. The split core transformer can include a primary winding (not shown) comprising the power line or conductor passing through the center of the two core halves, and a harvesting coil 202 around first core half 204a. The harvesting coil can be comprised, of any number of turns in order to establish the proper 'turns ratio" required for the operation of the circuitry. The power harvesting system 200 may further include a second harvesting coil around the second core half 204b (not shown).

The current induced in the harvesting core coil supplies AC power to the electronic circuits of the monitoring device. In general, the monitoring devices are designed to operate over a wide range of power grid distribution networks and operating conditions. In some embodiments, the monitoring devices are designed and configured to operate over a range of line currents between 5 amps and 800 amps.

Figure 3:
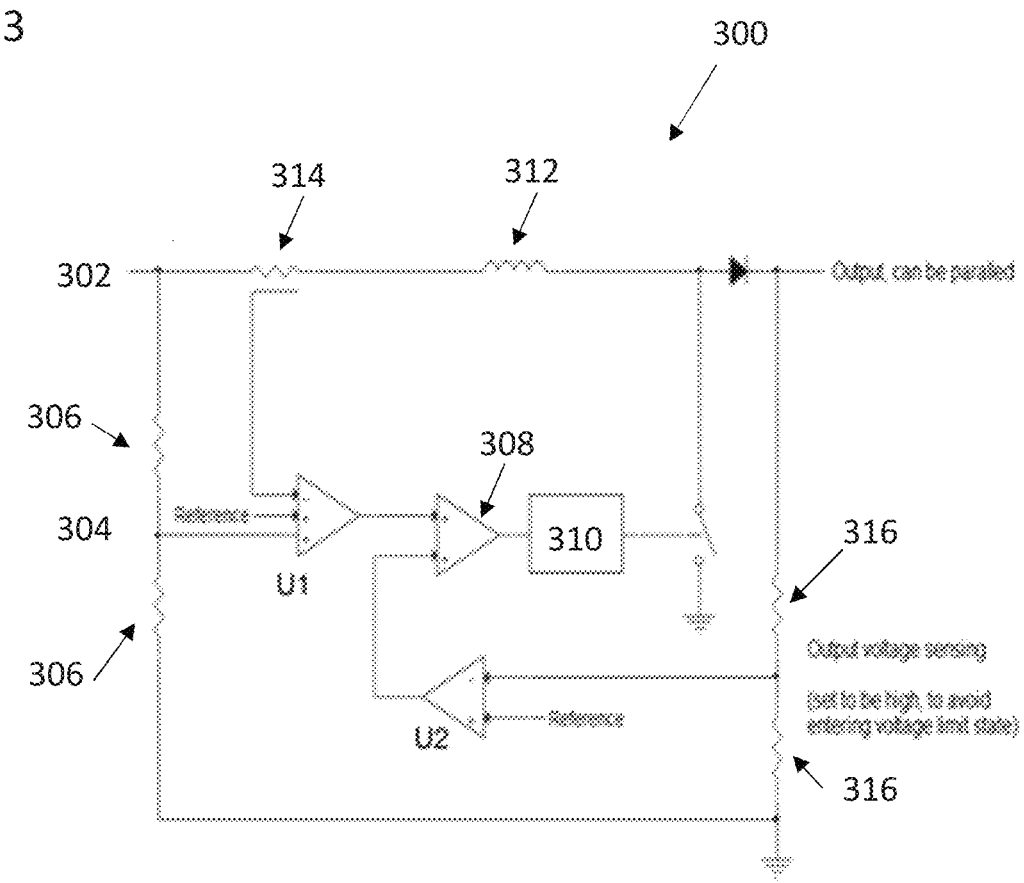
FIG. 3 shows an energy harvesting circuit configured to control the electrical output of an energy harvesting device and to allow for multiple instances to be paralleled.

FIG. 3 illustrates a schematic diagram of an energy harvesting circuit 300 configured to control the harvesting of power from a power distribution network. The energy harvesting circuit 300 is configured to receive input(s) from an energy harvesting device, as described above. Therefore, an energy harvesting circuit can be disposed within each of the energy harvesting devices described above. Alternatively, the energy harvesting circuits can be disposed within the monitoring device described above, and electrically connected to a corresponding energy harvesting device. However, it should be understood that each energy harvesting device is coupled to its own energy harvesting circuit.

The energy harvesting circuit 300 can receives an input voltage 302 and an input current 304 from an energy harvesting device. Resistors 306 represent a divider circuit configured to divide the input voltage down to a usable level for the energy harvesting circuit 300. Circuit U1 is configured to measure the input current 302 and the divided input voltage via resistors 306. The circuit U1 itself can comprise, for example, a plurality of cascading op-amps. The circuit U1 (e.g., a plurality of cascading op-amps) is designed and configured to be in balance when the input voltage 302 divided by the input current 304 is a predetermined resistance value. In one example the predetermined resistance is chosen to be 100 ohms to maximize the amount of current than can be extracted from the conductor(s) with the energy harvesting device(s). The output of circuit U1 goes above zero or below zero depending on if the energy harvesting circuit needs to be driven more or less to achieve balance in the circuit U1 (i.e., to achieve the predetermined resistance value). Thus, the output of circuit U1 determines if more or less is required to achieve the desired resistance.

The output of circuit U1 is fed into an error amplifier 308 and pulse width modulator 310. The error amplifier, pulse width modulator, boost inductor 312, and resistor 314 are configured to add or remove a load on the circuit which therefore adjusts the resistance of the circuit to the desired predetermined level. For example, the pulse width modulator operates at a certain frequency to make load of the circuit the predetermined resistance value (e.g., 100 ohms). The boost inductor 312 wants a constant current, so the boost inductor's output becomes the constant current. The amplifier US and the voltage divider formed by resistors 316 put an upper limit on the output voltage, which is set to be relatively high so as to avoid entering a voltage limit state in the circuit. The output current through diode 318 represents the maximum harvested current based on the operation of the circuit as described above.

Because of the output characteristics of the energy harvesting circuit, having neither a fixed output voltage, nor fixed output current, the maximum obtainable power will be delivered when the load resistance equals the equivalent source resistance of the energy harvesting circuit. This is in accordance with the "Maximum Power Transfer Theorem". The energy harvesting circuit of the present disclosure therefore is configured to sense the output voltage of the energy harvesting device and draw a ratiometric current such that the ratio of the input voltage to the input current equates to the desired loading resistance of the energy harvesting circuit.

The energy harvesting circuit includes a "boost" regulator and inductor which is configured to boost the input voltage to a level higher than the input. The schematic diagram of FIG. 3 shows how U1, with its inputs connected to both the input voltage and input current, will be able to maintain a constant resistance loading of the harvest device, since resistance is simply voltage divided by current. The output of the circuit is a current whose level is set by the available power of the harvesting device, when loaded with the constant resistance. The output voltage of the circuit depends on the ultimate load connected to the overall summed output. In order to limit the voltage to a practical level, U2 will establish a certain maximum voltage.

As noted above, the output voltage and current levels of the energy harvesting circuit are not fixed, but rather are free to establish themselves at the levels demanded by the desired resistance. The output voltage however, must be high enough to multiple devices to add their current without hitting an upper voltage limit.

The present disclosure further provides the ability to parallel multiple devices since the output is a current source. When paralleling current sources, the currents directly add together, while the voltage of the paralleled circuit will depend upon the load placed upon the circuit. Heavy loads will keep the paralleled voltage low, while a light load will allow the paralleled voltage to rise to some practical upper limit. Once an upper voltage limit is reached, current sharing can no longer maintained. However, it is important to note that operation at the voltage limit infers that ample power is being harvested and the need for current sharing is no longer a priority.

Figure 4:
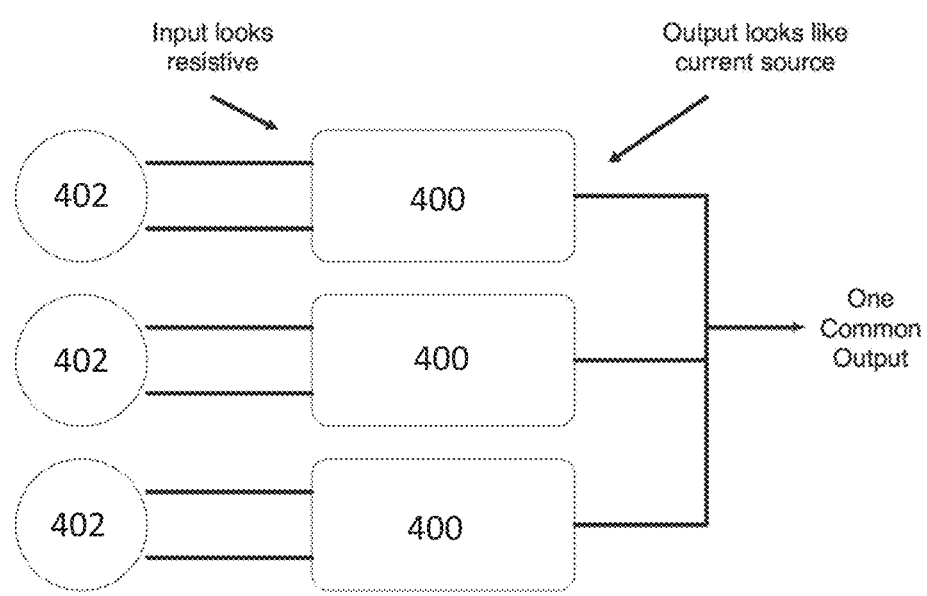
FIG. 4 is a schematic drawing showing multiple energy harvesting devices arranged in parallel to allow addition of output currents between the devices.

FIG. 4 is a schematic illustration of multiple energy harvesting devices 402 arranged in parallel, as described above. Each energy harvesting device is electrically connected to an energy harvesting circuit 400, such as the energy harvesting circuit described above. The output from each energy harvesting circuit comprises a current source. The arrangement of FIG. 4 advantageously provides an input that looks resistive but an output that looks like a current source, which allows for multiple devices to be placed in parallel to allow the currents to directly add together. The sum of all the currents can then be fed directly to a monitoring device (as described in FIG. 1) to provide power for the operation of the device.

The novelty of the present disclosure is the way the energy harvesting circuit loads the harvest device (the magnetic core and coil) with a constant resistance (its most efficient load) and then creates a "current" output, so that multiple instances can be paralleled. This energy harvesting circuit actively performs its current summing function only at very low currents, when it matters most. As soon as enough currents are summed so that the circuit hits the upper voltage limit (and sharing stops), the monitoring device has enough power. The constant resistance loading mentioned herein, allows each energy harvesting core to operate at its best point of power transfer.

Figure 5:
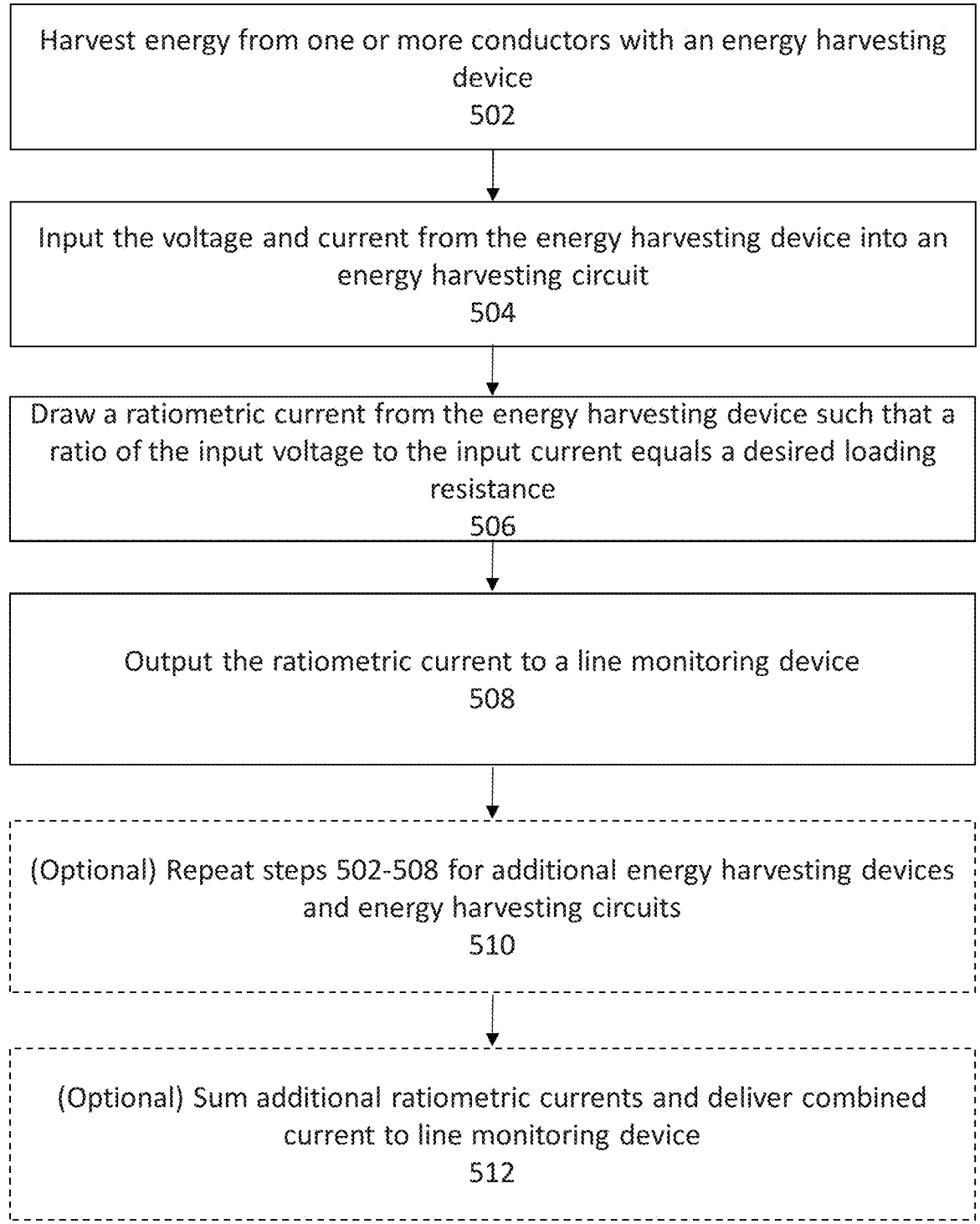
FIG. 5 is a flowchart describing one method of harvesting energy from a conductor of a power distribution network.

FIG. 5 illustrates a flowchart that describes a method for harvesting energy from one or more conductors of a power distribution network. At an operation 502, energy can be harvested from one or more conductors of a power distribution network with an energy harvesting device. As described above, one or more energy harvesting devices can be installed on one or more conductors of the power distribution network. In some examples, a single harvesting device is installed on each conductor. In other embodiments, more than one harvesting device can be installed on a single conductor, or on all conductors. The energy harvesting devices can comprise current transformers configured to induce a current proportional to the current flowing through the main conductors.

At an operation 504, the method can further comprise inputting the voltage and current from the energy harvesting device into an energy harvesting circuit. As described above, each energy harvesting device can include its own energy harvesting circuit. This circuit may be disposed within a housing of the harvesting device, or alternatively, may be located remotely from the harvesting device but be electrically coupled to the device.

At an operation 506, the method can further comprise drawing a ratiometric current from the energy harvesting device such that a ratio of the input voltage to the input current equals a desired loading resistance of the energy harvesting circuit. At operation 508, the ratiometric current can be outputted to a line monitoring device.

As described above, these devices and methods can be scaled to include multiple energy harvesting devices and circuits. Thus, in steps 510 and 512 of the flowchart, the method can include repeating these steps for additional energy harvesting devices and circuits, and summing the output currents to form a combined output current that can be used to power one or more line monitoring devices.

As for additional details pertinent to the present invention, materials and manufacturing techniques may be employed as within the level of those with skill in the relevant art. The same may hold true with respect to method-based aspects of the invention in terms of additional acts commonly or logically employed. Also, it is contemplated that any optional feature of the inventive variations described may be set forth and claimed independently, or in combination with any one or more of the features described herein. Likewise, reference to a singular item, includes the possibility that there are plural of the same items present. More specifically, as used herein and in the appended claims, the singular forms "a," "and," "said," and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Unless defined otherwise herein, all technical and scientific terms used herein have the same meaning as commonly understood by one of ordinary skill in the art to which this invention belongs. The breadth of the present invention is not to be limited by the subject specification, but rather only by the plain meaning of the claim terms employed.

What is claimed is:

1. A method of harvesting energy from one or more conductors of a power grid distribution network, comprising the steps of:
    harvesting energy from the one or more conductors with a first energy harvesting device installed on the one or more conductors;
    presenting an input current and an input voltage from the first energy harvesting device to a first energy harvesting circuit comprising an amplifier, a pulse width modulator, and a boost converter driven by the pulse width modulator, the boost converter comprising a switching device and an inductor; and
    based on operation of the boost converter, adjusting an inductor current flowing through the inductor to output a first ratiometric current from the first energy harvesting device with the first energy harvesting circuit such that a ratio of the input voltage to the input current equals a desired loading resistance of the first energy harvesting circuit.

2. The method of claim 1, further comprising:
    harvesting energy from the one or more conductors with a second energy harvesting device installed on the one or more conductors;
    presenting an input current and an input voltage from the second energy harvesting device to a second energy harvesting circuit;
    output a second ratiometric current from the second energy harvesting device with the second energy harvesting circuit such that a ratio of the input voltage to the input current equals a desired loading resistance of the second energy harvesting circuit;
    summing the first ratiometric current with the second ratiometric current to form a combined harvested current; and
    delivering the combined harvested current to a line monitoring device.

3. The method of claim 1, wherein the first energy harvesting circuit further comprises implementing a plurality of cascading op-amps to be in balance when the ratio of the input voltage to the input current equals a desired loading resistance of the first energy harvesting circuit.

4. The method of claim 1, wherein the desired loading resistance comprises 100 ohms.

5. An energy harvesting circuit configured to receive an input current and an input voltage from an energy harvesting device, comprising:
    a drive circuit configured to provide an output indicating if a load resistance of the energy harvesting circuit is above or below a desired load resistance; and
    a boost regulator circuit comprising a pulse width modulator, an inductor, and a switching device driven by the pulse width modulator, wherein, using the output from the drive circuit, the boost regulator circuit adjusts an inductor current of the inductor to adjust a ratiometric current output from the energy harvesting device such that a ratio of the input voltage to the input current equals the desired loading resistance of the energy harvesting circuit.

6. The circuit of claim 5, wherein the drive circuit comprises a plurality of cascading op-amps configured to be in balance when the input voltage divided by the input current equals the desired load resistance.

7. The circuit of claim 5, wherein the desired load resistance comprises 100 ohms.

8. The circuit of claim 5, the inductor being in series with a boost resistor.

9. The circuit of claim 5, further comprising an error amplifier; wherein the error amplifier, the pulse width modulator, a boost resistor, and the inductor collectively add or remove a load on the circuit to adjust the load resistance.

10. An energy harvesting system, comprising:
    a first energy harvesting circuit configured to receive a first input current and a first input voltage from a first energy harvesting device, the first energy harvesting circuit comprising:
        a first amplifier, and
        a first boost regulator circuit comprising a first pulse width modulator, a first inductor, and a first switching device driven at least in part by the first pulse width modulator, wherein, based at least in part on a first output from the first amplifier, a first inductor current of the first inductor is adjusted thereby controlling a first ratiometric current output from the first energy harvesting device such that a first ratio of the first input voltage to the first input current equals a first desired loading resistance of the first energy harvesting circuit;
    a second energy harvesting circuit configured to receive a second input current and a second input voltage from a second energy harvesting device, the second energy harvesting circuit comprising:
        a second amplifier, and
        a second boost regulator circuit comprising a second pulse width modulator, a second inductor, and a second switching device driven at least in part by the second pulse width modulator, wherein, based on a second output from the second amplifier, a second inductor current of the second inductor is adjusted thereby controlling a second ratiometric current output from the second energy harvesting device such that a second ratio of the second input voltage to the second input current equals a second desired loading resistance of the second energy harvesting circuit;

a summation circuit configured to sum the first ratiometric current with the second ratiometric current into a combined current output; and a line monitoring device configured to receive the combined current output for operation.

11. The system of claim 10, wherein the first amplifier and the second amplifier each include a plurality of cascading op-amps configured to be in balance when the input voltage divided by the input current equals the desired load resistance.

12. The circuit of claim 10, wherein the first desired load resistance comprises 100 ohms.

* * * * *